United States Patent [19]

Fishkin et al.

[11] Patent Number: 4,884,078
[45] Date of Patent: Nov. 28, 1989

[54] ANTENNA TEST AND MEASUREMENT SYSTEM

[75] Inventors: Theodore S. Fishkin, Lawndale; Mark Skidmore, Long Beach; Peter Dimitrijevic, Redondo Beach, all of Calif.

[73] Assignee: Hughes Aircraft Company, Los Angeles, Calif.

[21] Appl. No.: 891,828

[22] Filed: Aug. 1, 1986

[51] Int. Cl.[4] .............................................. H01Q 3/00
[52] U.S. Cl. .................................... 342/360; 342/174
[58] Field of Search .............. 342/360, 351, 173, 174; 343/703; 455/67

[56] References Cited

U.S. PATENT DOCUMENTS

| | | | |
|---|---|---|---|
| 2,701,876 | 2/1955 | Mottley et al. | 342/360 |
| 3,166,748 | 1/1965 | Shanks et al. | 342/351 |
| 3,378,846 | 4/1968 | Lowenschuss | 342/360 |
| 3,662,389 | 5/1972 | Coffin et al. | 342/360 |
| 3,825,931 | 7/1974 | Gonzalez et al. | 455/67 X |
| 3,939,474 | 2/1976 | Coleman et al. | 342/202 X |
| 3,999,117 | 12/1976 | Gyugyi et al. | 323/211 |
| 4,118,668 | 10/1978 | Strayer, Jr. | 455/67 |
| 4,197,856 | 4/1980 | Northrop | 128/660 |
| 4,199,668 | 4/1980 | Scozzari | 455/67 X |
| 4,396,918 | 8/1983 | Wallis | 342/388 |
| 4,488,155 | 12/1984 | Wu | 342/174 X |
| 4,510,622 | 4/1985 | Mori et al. | 455/67 |
| 4,553,145 | 11/1985 | Evans | 343/703 X |

FOREIGN PATENT DOCUMENTS 1067202 11/1979 Canada ............................ 342/360

OTHER PUBLICATIONS

"Intermediate Distance Antenna Measurement Techniques", K. M. Keen et al., International Conference on Antennas & Propagation, 1978.
"Test Procedure for Antennas", IEEE No. 149, Jan. 1965, p. 16.

Primary Examiner—Thomas H. Tarcza
Assistant Examiner—Tod R. Swann
Attorney, Agent, or Firm—Steven M. Mitchell; Wanda K. Denson-Low

[57] ABSTRACT

An improved antenna test and measurement system including a transmit antenna; means for providing a test signal to said transmit antenna and initiating the transmission thereof; a receive antenna adapted to receive the test signal as transmitted by said transmit antenna; an amplitude detector for detecting the amplitude of the received test signal; and an open loop phase detector for measuring the phase of the received test signal relative to a reference signal.

3 Claims, 1 Drawing Sheet

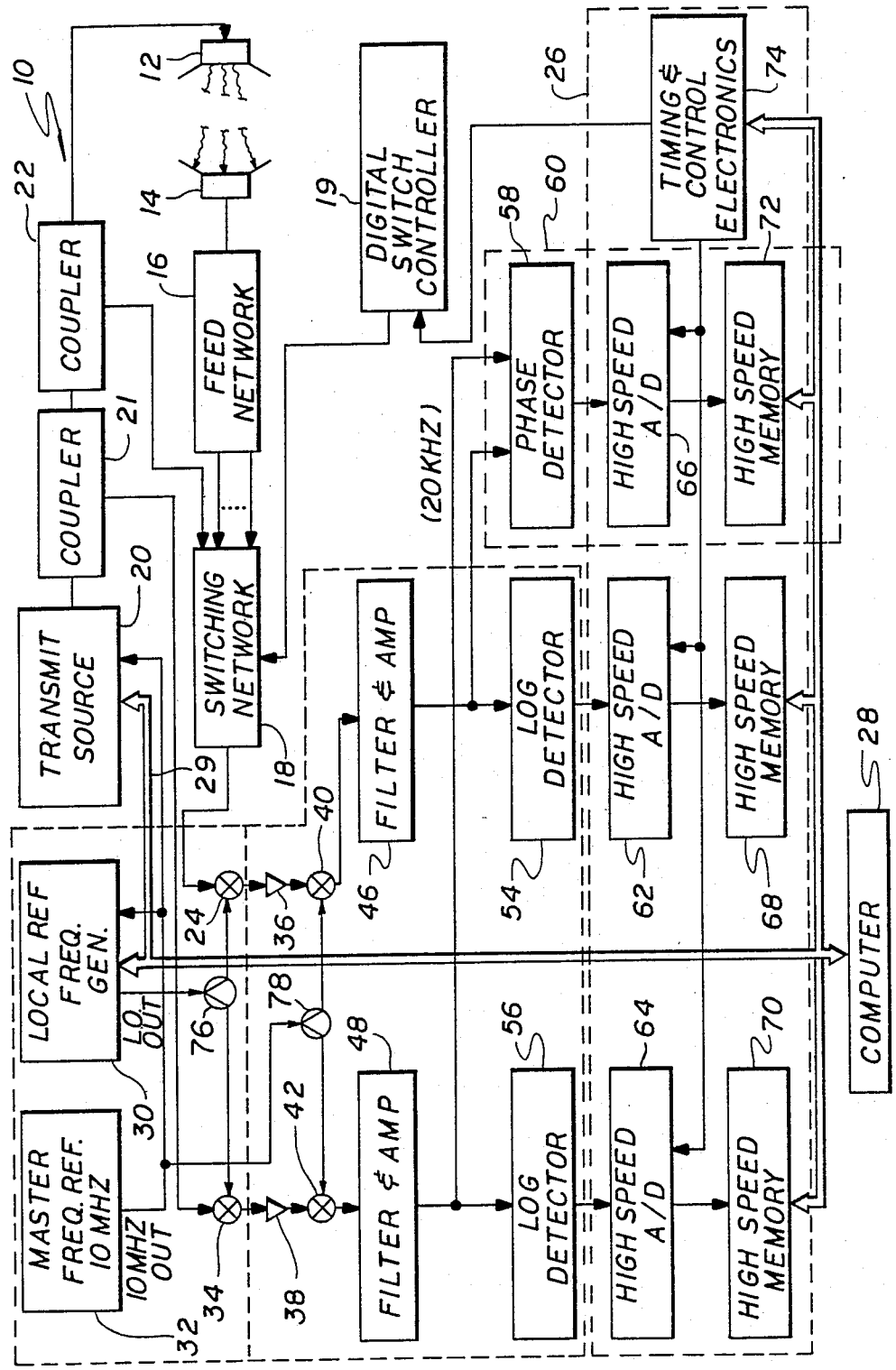

ANTENNA TEST AND MEASUREMENT SYSTEM

BACKGROUND OF THE INVENTION

1. Field of the Invention

The present invention relates to test and measurement systems. More specifically, the present invention relates to systems employed to make amplitude and phase measurements of antennas in near field range, far field range, and compact range measurement systems.

While the present invention is described herein with refernce to a preferred embodiment in an illustrative application, it is to be understood that the invention is not limited thereto. Those having ordinary skill in the art and access to the teachings of the present invention will recognize additional modifications, embodiments and applications within the scope thereof.

2. Description of the Related Art

The high cost associated with the manufacture and launch of satellite systems and the subsequent inaccessibility thereof makes it imperative that the satellite be designed in all respects to provide reliable performance throughout its useful life. As a key component of the system, the antenna and its design must be proven to be satisfactory prior to launch. Accordingly, antenna test and measurement systems are used to fully exercise the antennas in their many modes of operation.

Test ranges are currently classified as one of three types: (1) far field ranges; (2) near field ranges; and (3) compact ranges.

The far field range is an open loop system in which the test equipment is physically mounted a sufficient distance from the antenna under test to detect and measure its actual beam pattern. In far field ranges, it is typically sufficient to measure the amplitude or gain of the antenna.

In near field ranges, the test equipment is mounted in close physical proximity to the antenna under test. In near field ranges, it is typically necessary to make phase as well as amplitude measurements from which the actual antenna beam pattern may be extrapolated. The near field systems are typically closed loop in that the activation and positioning of the transmit antenna and the collection of data from the antenna under test are under the control of a single system controller.

In a compact test range, a reflector is used between the antenna under test and the measurement apparatus to simulate the longer path length of a far field range.

In each system the tests performed are typically quite extensive. Input and/or output beam characteristics are often tested as a function of many variables, parameters ad operating conditions. The amplitude or gain, for example, may be measured as a function of frequency, azimuth, elevation, distance and/or time. (Amplitude measurements can be translated to gain measurements given the typically available reference input signal amplitude.) Numerous combinations and permutations of variables may be used as part of a single testing program.

In addition, where the antenna is of the phased array variety having a plurality of sensing and/or receiving elements (feeds), beam forming networks, input andoutput channels and/or input and output ports, the test may involve switching various combinations of feeds through various combinations of channels and ports. It is often desirable to run such tests using any of several signal polarization states and frequencies.

It is not difficult then to imagine how in some tests, as many as ten million gain measurements alone may be required. This is typically a time consuming process requiring specialized equipment and personnel skilled in the field. As such, the testing of the antenna often adds significantly to the development and manufacturing cost of the overall system. There is therefore a generally recognized need in the art to minimize the time required to completely test such antennas.

There is a countervailing need to perform more and more tests as antennas become more capable and complex. For example, while the antenna scans in azimuth, it was typically necessary to make a gain measurement at certain ports, channels and feeds at a specific frequency. However, there has now been recognized a need to make such measurements while simultaneously hopping through many frequencies.

Conventional measurement systems have had difficulty meeting the demanding requirements of this application. The operating speed of conventional systems has been a primary limitation. Limitations on the speed of conventional systems may result from the scheme used to detect and measure input power or gain and/or the capability of the system to switch from one set of ports to another.

Many prior art systems also require a computer to control the complex system through the testing program. In such systems, the computer is required to set up and energize the antennas, switch channels in and out of the testing apparatus, make the desired measurements, and process and store the resulting data. In order to provide for additional increases in system speed and operational capability, it is generally desirable to free the computer from such tasks.

Network analyzers have heretofore enjoyed limited utility in near field ranges. A network analyzer is a system that provides one input signal corresponding to the amplitude of an input signal usually relative to a reference signal, and a second output signal corresponding to the phase of the input signal relative to a reference signal. Network analyzers typically have a broad band input frequency range which substantially prohibits their use in far field ranges. That is, the wide input frequency range permits too many extraneous signals to reach the detectors to provide sufficiently accurate readings. Thus, use of a network analyzer for the near field forced the use of another system for the typically necessary far field range measurement. This significantly increases the cost of making both measurements.

Even in near field applications, network analyzers typically required elaborate control software and switching systems to which it was difficult to add additional channels.

A need was therefore recognized in the art to provide a flexible system that could easily be used in both near and far field test ranges. Such a system is presently provided by the Scientific Atlanta model 2020. This system provides amplitude and phase measurements in the near field range and amplitude measurements in the far field range.

However, such systems typically suffer several shortcomings. For example, a phase locked loop is typically employed to lock on to and measure the amplitude and phase of the input signal. As such, these systems are typically too slow for frequency hopping applications.

Secondly, the Scientific Atlanta systems typically require substantial computer interaction. That is, the computer is required to input each data point individually, as well as perform all other functions one at a time. This wastes considerable time in transmitting commands and data back and forth along the bus in addition to waiting for replies where necessary. This is undesirable for the reasons mentioned above, namely, tasking the computer forces a limitation on the overall speed of the system.

A third shortcoming of such systems is due to the fact that the system fo port switching only allows for switching between two ports at a time. To use such systems in applications requiring additional ports and/or channels requires the purchase of additional switching systems.

Thus, relative to the related art, there is a general need for an antenna test system that is useful in both the near, far, and compact ranges which is fast, flexible, and requires minimal interaction with the system control computer.

SUMMARY OF THE INVENTION

The need illustrated by the related art is substantially addressed by the antenna test and measurement system of the present invention which includes a transmit antenna; means for providing a test signal to said transmit antenna and initiating the transmission thereof; a receive antenna adapted to receive the test signal as transmitted by said transmit antenna; an amplitude detector for detecting the amplitude of the received test signal; and an open loop phase detector for measuring the phase of the received test signal relative to a reference signal.

A particular embodiment includes circuitry for providing a reference signal which is substantially equal to said test signal. In a specific embodiment, the test and measurement operation is performed by a controller which stores data provided thereby for subsequent access by a computer.

BRIEF DESCRIPTION OF THE DRAWINGS

FIG. 1 is a diagramatic representation of an illustrative embodiment of the present invention in a near field antenna test range.

DESCRIPTION OF THE INVENTION

As illustrated in the drawings and discussed more fully below, the present invention provides a high speed wide range antenna gain and phase measurement system. The application of T. Fishkin et al for an "Improved Test and Measurement System for Antennas", Ser. No. 06/819,964, discloses an antenna test system of the type for which the present invention was developed. The system disclosed therein has a response time that is improved relative to conventional systems by the elimination of the requirement of phase locking on the incoming signal prior to making the gain or amplitude measurement. The present invention is a further improvement over the system disclosed in the prior application inasmuch as it discloses a high speed, wide range system for measuring phase as well as amplitude data in an advantageous manner not shown by the prior art.

FIG. 1 shows the antenna test and measurement system 10 in a near field test range configuration. It is understood that the present invention may be used in a far field range, by adding means for providing a control signal to the transmit (source) antenna which is located at a remote site, or in a compact range, by adding a reflector, as is known in the art.

The invention 10 includes a transmit antenna 12 and a receive antenna 14. The antennas 12 and 14 may be of conventional or experimental design. Not shown are associated feed horns and other hardware which those of ordinary skill in the art will recognize as incidental to the antennas 12 and 14. It is understood that the size, shape, configuration and performance parameters of the test antenna would be optimized to fit the test requirements. Either antenna 12 or 14 may be the antenna under test or the test antenna.

The receive antenna 14 receives signals over free space from the source antenna 12 and provides a micro wave output signal which may vary in amplitude, phase and frequency during the course of the test program. A feed network 16 is connected to the receive antenna 14. The feed network 16 is a matrix which provides a coupling between the feeds of the antenna 14 and the switching network 18. In the configuration shown in FIG. 1, the receive antenna 14 is the antenna under test and the transmit antenna 12 is the source antenna. It is understood that to make the transmit antenna 12 the antenna under test would require the connection of the switching network to the transmit antenna 12 such as that shown in connection with the receive antenna 14. The switching network 18 is a standard pin diode switch currently available off-the-shelf from Micro Dynamics for example.

In the illustrative embodiment of FIG. 1, the switching network 18 operates under control of the digital switch controller 19 to sequentially access either one of seven outputs from the feed network 16 or the output of the test source 20 via coupler 22. Each of the eight inputs is selectively input to a mixer 24. The test source 20 is an off-the-shelf frequency synthesizer such as the model 8673B sold by the Hewlett Packard Corporation. The test source 20 may be programmed to generate test frequencies in response to a trigger from the controller 26 (discussed more fully below) or under command of the computer 28 via the instrument bus 29 which may be an IEEE 488 bus or equivalent.

The second input to the mixer 24 is provided by a local reference frequency generator 30 via in-phase power divider 76. In the illustrative embodiment, the local reference frequency generator 30 is also a model 8673B provided by Hewlett Packard. It is set to generate a signal which is 10.02 MHz. below the test frequency provided by the test source 20. Thus, the output of the mixer 24 is 10.02 MHz signal.

A second mixer 34 is included to provide a reference channel. Inputs to the second mixer 34 are provided by the transmit source 20 and the local reference frequency generator 30 from divider 76. The mixers 24 and 34 are standard double balanced mixers which may be acquired off-the-shelf from RHG Electronics as model DMB2-18 mixers.

The output of the mixers 24 and 34 is input to amplifiers 36 and 38 respectively. Though shown as single stage amplifiers, in the illustrative embodiment, two off-the-shelf amplifiers were used for each. The amplifiers 36 and 38 may be purchased as models CA 75-3 and CA 88 from Watkins-Johnson Company. The amplifiers should provide enough gain to offset mixer and pad losses and still have enough gain to produce a usable output down to and including the bottom of the input dynamic range. The amplifiers chosen should provide high gain, low noise, and a high compression point to insure good linearity up to and including the top of the input dynamic range.

The output of amplifier 36 is an amplified 10.02 MHz signal with amplitude and phase data relative to the output of amplifier 38 in the reference channel. Amplifier 36 feeds mixer 40 while amplifier 38 feed mixer 42. A 10 MHz signal is provided as a second input to each mixer 40 and 42 by a master reference frequency generator 32 via in-phase power divider 78. The reference frequency generator 32 also provides a reference signal to the test source frequency synthesizer 20 and the reference frequency source 30. All oscillators in the system are thus locked to the master reference frequency generator. This minimizes frequency uncertainty and allows for minimum filter bandwidths and improved measurement accuracy at low input signal levels. The frequency generator of the illustrative embodiment was a model 9478 provided by Racal Dana. The mixers 40 and 42 multiply the outputs of amplifiers 36 and 38 by the 10 MHz reference signal and provide output signals of fixed IF frequency (20 KHz in the illustrative embodiment) regardless of the frequency under test. This simplifies the filter requirements for the power detector portion as discussed below. The mixers were chosen to allow a high IF gain (provided by the amplifiers 36 and 38) while still preserving linearity at the top of the dynamic range. Thus, the mixers chosen for the illustrative embodiment were Watkins-Johnson's MT9ECs.

The first mixer 24, first amplifier 36 and third mixer 40 thus provide first means for downconverting the received signal. Similarly, the second mixer 34, second amplifier 38 and fourth mixer 42 provide second means for downconverting the reference signal.

The 20 KHz signals are input to filter and amplifier circuits 46 and 48 to reject noise and higher order products that may be present therein. In the illustrative embodiment, the filters are custom devices (model #7692) provided by Frequency Devices Incorporated and the amplifiers are OP27 and OP37 operational amplifiers manufactured by Precision Monolithics Inc.

The amplified and filtered 20 KHz signals are split into two paths: one to a log detector 54 or 56 respectively and one to a phase detector 58 of a phase detection subsystem 60. While the log detectors 54 and 56 may be of any suitable conventional design, in the preferred embodiment, the log detector of copending application entitled HIGH SPEED WIDE RANGE VARIABLE RATE POWER DETECTOR by P. Dimitrijevic, M. Skidmore, and T. Fishkin, filed July 3, 1986 Serial No. 881,985 would be used. The disclosure of which is hereby incorporated by reference. The phase detector 58 is an off-the-shelf conventional open-loop phase detector such as an SL651 provided by Plessy Semiconductor. The log detectors 54 and 56 and the phase detector 58 analog output are converted to digital signals by the high speed analog-to-digital (A/D) converters 62, 64, 66 of the controller 26. The digitized signals are stored in memories 68, 70, 72. The controller 26, converters 62, 64, 66 and associated memories 68, 70, 72, and timing and control electronics 74 are integrated with an off-the-shelf multiprogrammer made by Hewlett Packard.

In operation, a test is initiated by the computer 28 placing signals on the bus 29 which either sets the test and reference frequencies of the transmit source 20 and the local reference frequency generator 30 or signals the controller 26 to trigger the pre-programmed sequence of test signals of the test source 20 and the local reference frequency generator 30 depending on the implementation chosen. In either case, the transmit source 20 sends a test signal to the transmit antenna 12 which in turn radiates the test signal over free space to the receive antenna 14. Through the digital switch controller 19, the controller 26 commands the switching network to pass signals from each of its inputs sequentially (or selectively depending on the implementation) to the receiver channel comprising the mixer 24, amplifier 36, and mixer 40. A reference signal is provided to the reference channel comprising mixer 34, amplifier 38 and mixer 42. Both the receive signal and the reference signal are downconverted, filtered and amplified as discussed above to provide the 20 KHz reference and receive signals. The amplitude of the received and reference signals are measured by the log detectors 54 and 56 respectively. The phase of the receive signal is measured relative to the reference signal by the open loop phase detector 58. As mentioned above, the outputs of the detectors are converted to digital signals and stored in high speed memories 68, 70, 72 for convenient access by the computer 28.

While the present invention has been described herein with reference to a particular embodiment for an illustrative application, it is understood that the invention is not limited thereto. Those of ordinary skill in the art and access to the teachings of the present invention will recognize additional embodiments and applications within the scope thereof.

As mentioned above, the invention may be used in near, compact, and far field test ranges. The antenna under test may be treated in the transmit mode or the receive mode. The means for switching and downconverting the input signals can be changed without departing from the scope of the invention. The invention was designed to utilize off-the-shelf components. Thus, the log and phase detectors may be substituted with commercially available detectors without departing from the scope of the invention. Similarly, the means for digitizing and storing the output is not critical to the invention.

The present invention has utility outside of the illustrative application. For example, the present invention may be used in a number of automated applications that require rapid and precise RF power and phase measurements. The present invention has specific applicability as a network analyzer. Other applications of the present invention include radar systems and test equipment, transmit-receive signal strength indicators, spectrum analyzers, microwave/millimeter wave field strength meters and etc. when configured with suitable control and down conversion equipment.

It is intended by the appended claims to cover any and all such modification, embodiments, and applications. Therefore,

What is claimed is:

1. An antenna test and measurement system for use in far field and near field antenna test ranges comprising:
   a transmit antenna;
   means for providing a test signal to said transmit antenna and initiating the transmission thereof;
   a receive antenna adapted to receive said test signal transmitted by said transmit antenna;
   means for detecting the amplitude of the received test signal;
   an open loop phase detector for measuring the phase of the received test signal relative to a reference signal; and
   means for detecting the amplitude of the reference signal.

2. An antenna test and measurement system for use in far field and near field antenna test ranges comprising:

a transmit antenna;

means for providing a test signal to said transmit antenna and initiating the transmission thereof;

a receive antenna adapted to receive said signal transmitted by said transmit antenna;

means for providing a reference signal which is substantially equal to said test signal;

first means for downconverting said received test signal;

second means for downconverting said reference signal;

first detector means for detecting the amplitude of the downconverted received test signal;

second detector means for detecting the amplitude of said downconverted reference signal; and an open loop phase detector for measuring the phase of the received test signal relative to said reference signal.

3. An improved method of testing and measuring an antenna comprising the steps of:

(a) initiating the transmission of a test signal from a transmit antenna;

(b) receiving the transmitted signal;

(c) detecting the amplitude of the received test signal;

(d) providing a reference signal which is substantially equal to said test signal;

(e) detecting the amplitude of the reference signal; and (f) detecting the phase of the received test signal relative to the reference signal using open loop phase detection.

* * * * *